(12) United States Patent
Venezia et al.

(10) Patent No.: US 8,330,195 B2
(45) Date of Patent: Dec. 11, 2012

(54) MULTILAYER IMAGE SENSOR PIXEL STRUCTURE FOR REDUCING CROSSTALK

(75) Inventors: Vincent Venezia, Los Gatos, CA (US); Ashish Shah, Milpitas, CA (US); Rongsheng Yang, Palo Alto, CA (US); Duli Mao, Sunnyvale, CA (US); Yin Qian, Milpitas, CA (US); Hsin-Chih Tai, San Jose, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 134 days.

(21) Appl. No.: 12/967,759

(22) Filed: Dec. 14, 2010

(65) Prior Publication Data

US 2011/0085067 A1   Apr. 14, 2011

Related U.S. Application Data

(62) Division of application No. 12/430,006, filed on Apr. 24, 2009, now Pat. No. 7,875,918.

(51) Int. Cl.
*H01L 31/062* (2012.01)
(52) U.S. Cl. ............................... 257/294; 257/E27.133
(58) Field of Classification Search .................. None
See application file for complete search history.

(56) References Cited

U.S. PATENT DOCUMENTS

| | | | |
|---|---|---|---|
| 5,859,462 A | 1/1999 | Tredwell et al. | |
| 6,163,030 A * | 12/2000 | Johnson et al. | 250/370.14 |
| 6,218,691 B1 | 4/2001 | Chung et al. | |
| 6,667,468 B2 * | 12/2003 | Kurosawa et al. | 250/208.1 |
| 2006/0043511 A1 * | 3/2006 | Nomura et al. | 257/432 |
| 2006/0124977 A1 | 6/2006 | Shinohara et al. | |
| 2006/0163618 A1 * | 7/2006 | Park | 257/221 |
| 2007/0069315 A1 | 3/2007 | Stevens et al. | |
| 2007/0108487 A1 | 5/2007 | Inoue et al. | |
| 2007/0284679 A1 | 12/2007 | Ohtsuka et al. | |
| 2008/0224190 A1 * | 9/2008 | Lee et al. | 257/292 |
| 2009/0267070 A1 | 10/2009 | Venezia et al. | |

FOREIGN PATENT DOCUMENTS

WO      WO 02/27804 A2    4/2002
WO      WO 2007/024819 A1 3/2007

OTHER PUBLICATIONS

EP Application No. 10250805.8, Extended European Search Report mailed May 16, 2012, 5 pages.
Notice of First Office Action for Chinese Patent Application No. 201010159246.5 mailed Oct. 10, 2011, 9 pages (with English Translation).

* cited by examiner

*Primary Examiner* — Ha Tran T Nguyen
*Assistant Examiner* — Vongsavanh Sengdara
(74) *Attorney, Agent, or Firm* — Blakely Sokoloff Taylor & Zafman LLP

(57) ABSTRACT

An image sensor pixel includes a substrate, a first epitaxial layer, a collector layer, a second epitaxial layer and a light collection region. The substrate is doped to have a first conductivity type. The first epitaxial layer is disposed over the substrate and doped to have the first conductivity type as well. The collector layer is selectively disposed over at least a portion of the first epitaxial layer and doped to have a second conductivity type. The second epitaxial layer is disposed over the collector layer and doped to have the first conductivity type. The light collection region collects photo-generated charge carriers and is disposed within the second epitaxial layer. The light collection region is also doped to have the second conductivity type.

11 Claims, 10 Drawing Sheets

MULTILAYER IMAGE SENSOR PIXEL STRUCTURE FOR REDUCING CROSSTALK

CROSS-REFERENCE TO RELATED APPLICATIONS

The present application is a Divisional of U.S. patent application Ser. No. 12/430,006, filed on Apr. 24, 2009.

This patent application is related to commonly-owned U.S. patent application Ser. No. 12/109,134, filed Apr. 24, 2008, entitled MULTILAYER IMAGE SENSOR PIXEL STRUCTURE FOR REDUCING CROSSTALK.

BACKGROUND

Image sensors have become ubiquitous. They are widely used in digital still cameras, cellular phones, security cameras, as well as in, medical, automobile, and other applications. The technology used to manufacture image sensors, and in particular, complementary metal-oxide-semiconductor ("CMOS") image sensors ("CIS"), has continued to advance at great pace. For example, the demands of higher resolution and lower power consumption have encouraged the further miniaturization and integration of these image sensors.

FIG. 1 illustrates a conventional front side illuminated CIS pixel 100. The front side of CIS pixel 100 is the side of a P+ substrate 105 upon which pixel circuitry 130 is disposed and over a which metal stack 110 for redistributing signals is formed. The metal layers (e.g., metal layer M1 and M2) are patterned in such a manner as to create an optical passage through which light (indicated by dashed arrows) incident on the front side of CIS pixel 100 can reach a photosensitive or photodiode ("PD") region 115. To implement a color CIS, the front side of CIS pixel 100 further includes a color filter layer 120 disposed under a microlens 125. Microlens 125 aids in focusing the light onto PD region 115.

CIS pixel 100 includes pixel circuitry 130 (indicated by a dashed rectangle) disposed adjacent to PD region 115 within a P doped well. Pixel circuitry 130 provides a variety of functionality for regular operation of CIS pixel 100. For example, pixel circuitry 130 may include circuitry to commence acquisition of an image charge within PD region 115, to reset the image charge accumulated within PD region 115 to ready CIS pixel 100 for the next image, or to transfer out the image data acquired by CIS pixel 100.

FIG. 2 illustrates details of a portion of two neighboring CIS pixels 100 formed within a P– epitaxial ("epi") layer 140 disposed over P+ substrate 105 and separated by shallow trench isolation regions (STI). When a photo-generated charge carrier is formed shallow within the CIS pixel (e.g., a first charge carrier 150), it experiences a strong upward attractive force (shown by arrows 200) towards PD region 115, due to a depletion region or P-N junction found between the PD and the surrounding epitaxial layer. When a photo-generated charge carrier is formed deeper within the CIS pixel (e.g., a second charge carrier 155), it initially experiences a weaker upward repulsive force due to the presence of a dopant gradient at the junction between P– epi layer 140 and P+ substrate 105.

Crosstalk is a serious problem in image sensors. There are generally three components to crosstalk: a) electrical crosstalk, b) optical crosstalk, and c) spectral crosstalk. Electrical crosstalk results when charge carriers generated in one pixel of an image sensor are collected by a neighboring pixel of the image sensor. Optical crosstalk can be caused by the diffraction and/or scattering of light off of metal lines and at interfaces between the dielectric layers within metal stack 110. Spectral crosstalk results from the finite (nonzero) transmittance of color filter 120 to wavelengths outside its target pass band, such as the finite transmittance of green and blue wavelengths through a red filter.

One form of electrical crosstalk is lateral drift of photo-generated charge carriers created deep in the semiconductor epitaxial layers (e.g., second charge carrier 155). As these photo-generated charge carriers rise, they can drift laterally and end up collected in the PD region of a neighboring pixel. Blooming is another form of electrical crosstalk characterized by the lateral diffusion of charge carriers when a PD region becomes full or saturated with charge carriers. Blooming is most commonly experienced in high luminous environments. Photo carriers that are generated near a saturated PD region 115 will not be collected and therefore remain free to diffuse laterally into a neighboring pixel. Blooming results in the blurring of edges in still images and streaking in moving images. Both forms of electrical crosstalk are due to charge carriers generated in one pixel being collected by a neighboring pixel.

SUMMARY

In one embodiment, electrical crosstalk between image sensor pixels is reduced relative to traditional image sensor pixels by disposing a collector layer below the photodiode regions which acts to prevent carriers formed deep within the photodiode regions from being collected in neighboring photodiode regions. Under proper bias conditions a field is established by which photo-generated carriers are swept away from locations deep within the photodiode regions and collected by the collector layer below the photodiode regions in order to prevent their collection by adjacent photodiodes.

In another embodiment electrical crosstalk between image sensor pixels is reduced relative to traditional image sensor pixels by disposing a barrier layer at least partially covering a collector layer, the barrier layer acting to prevent carriers formed deep within the photodiode regions from being collected in neighboring photodiode regions. Under certain bias conditions a field is established by which photo-generated carriers are swept away from locations deep within the photodiode regions and collected by the collector layer below the photodiode regions in order to prevent their collection by adjacent photodiodes. Additionally there is created a field between the barrier layer and the photodiode region that provides for increased collection within the photodiode regions of carriers generated moderately deep within photodiode regions.

BRIEF DESCRIPTION OF THE DRAWINGS

Exemplary embodiments are described with reference to the following figures, wherein like reference numerals refer to like parts throughout the various views unless otherwise specified.

DETAILED DESCRIPTION

Figure 1:
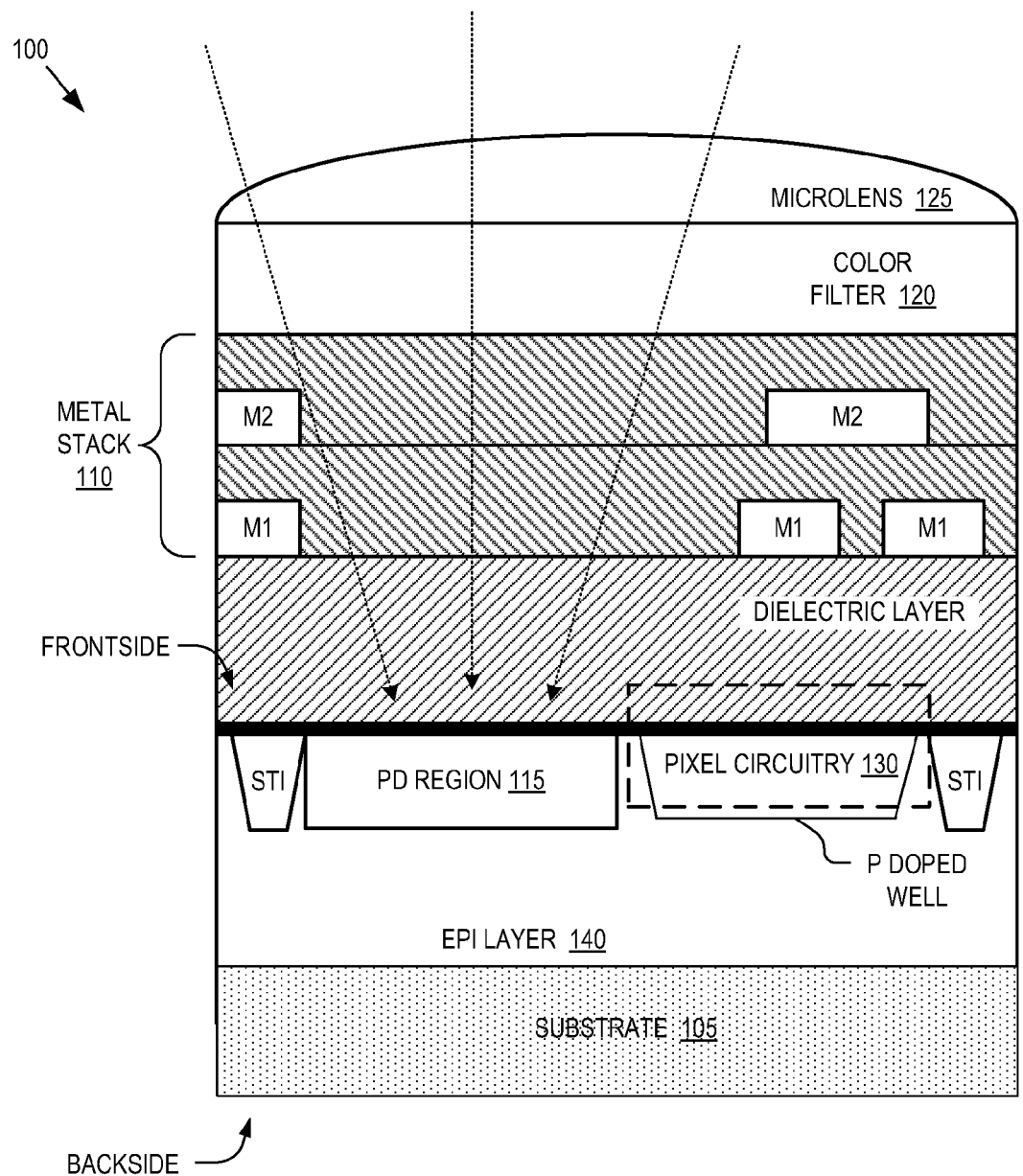
FIG. 1 is a cross sectional view of a conventional front side illuminated CMOS image sensor pixel.
Figure 2:
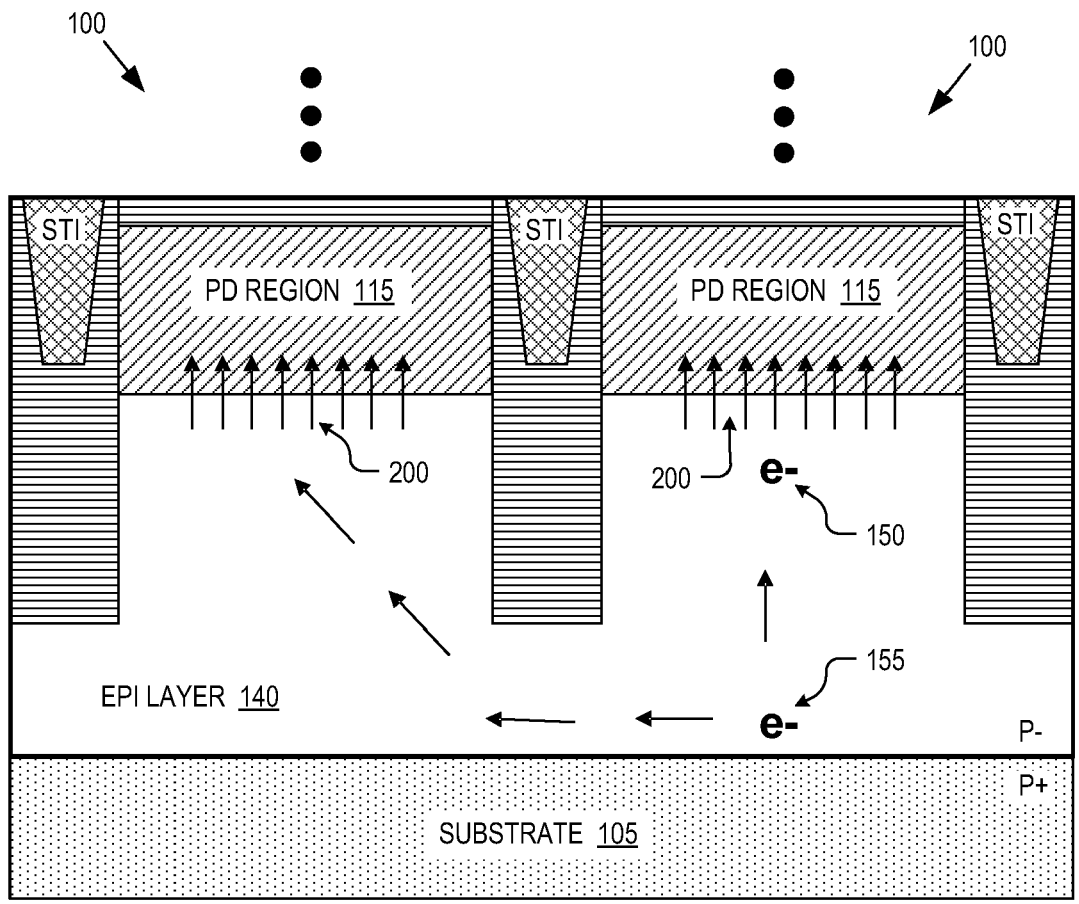
FIG. 2 is a cross sectional view of two neighboring CMOS image sensor pixels illustrating a mechanism for electrical crosstalk.
Figure 9:
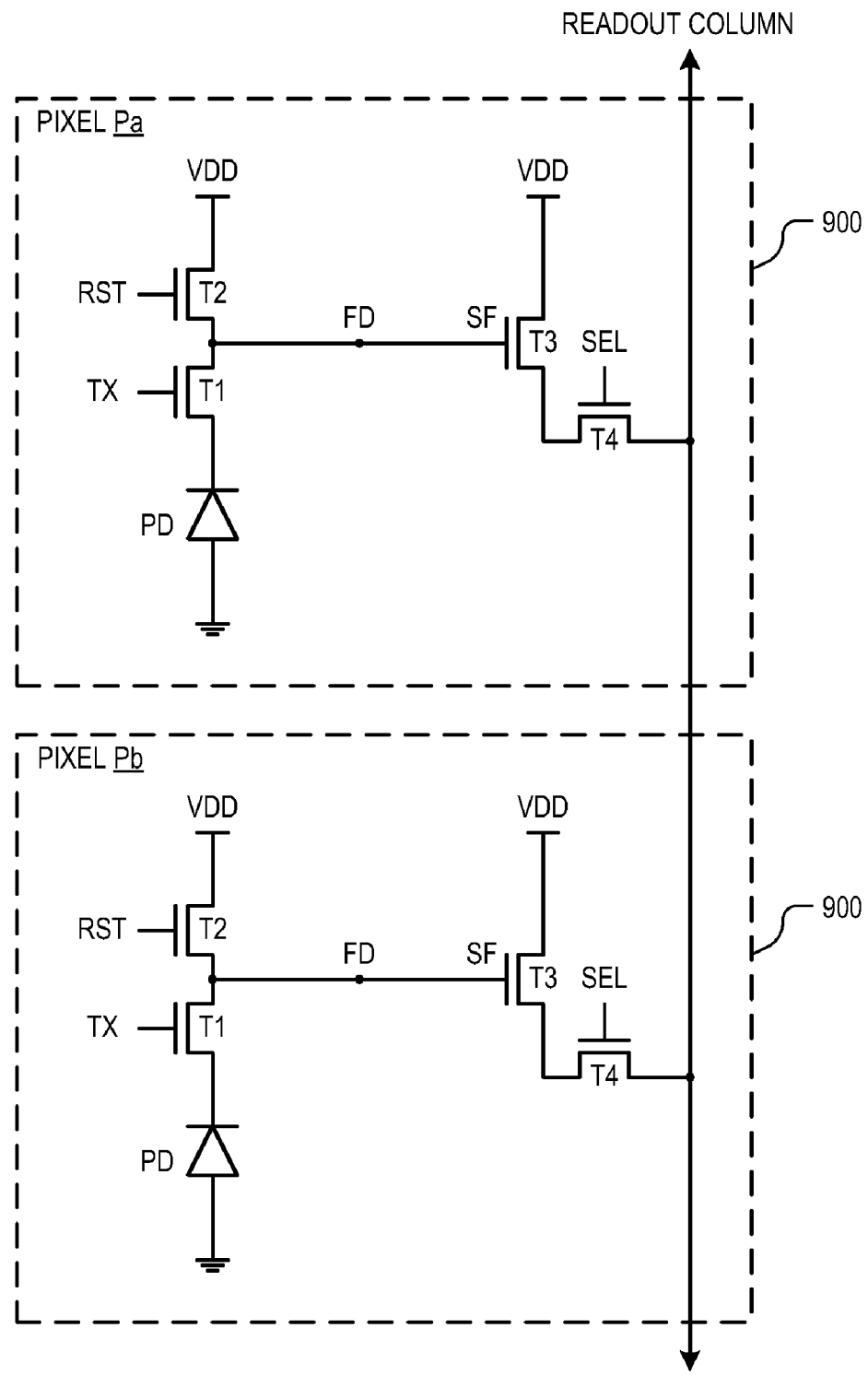
FIG. 9 is a circuit diagram illustrating sample pixel circuitry of two image sensor pixels within an image sensor array, in accordance with an embodiment.

Embodiments of a pixel, an image sensor, an imaging system, and methods of fabrication of a pixel, image sensor, and imaging system having improved electrical crosstalk characteristics are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects. For example, although not illustrated, it should be appreciated that image sensor pixels (reference numbers 300, 400, 500, 600, and 700 in the figures) may include a number of material layers disposed on the front side, such as those illustrated in FIG. 1 (e.g., pixel circuitry 130, a dielectric layer, metal stack 110, color filter 120, microlens 125, etc.), as well as other conventional layers (e.g., antireflective films, etc.) used for fabricating CIS pixels. Furthermore, the illustrated cross sections of image sensor pixels illustrated herein do not illustrate the pixel circuitry associated with each pixel. However, it should be appreciated that each pixel may include pixel circuitry (e.g., as shown in FIG. 9) coupled to its collection region for performing a variety of functions, such as commencing image acquisition, resetting accumulated image charge, transferring out acquired image data, or otherwise.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 3:
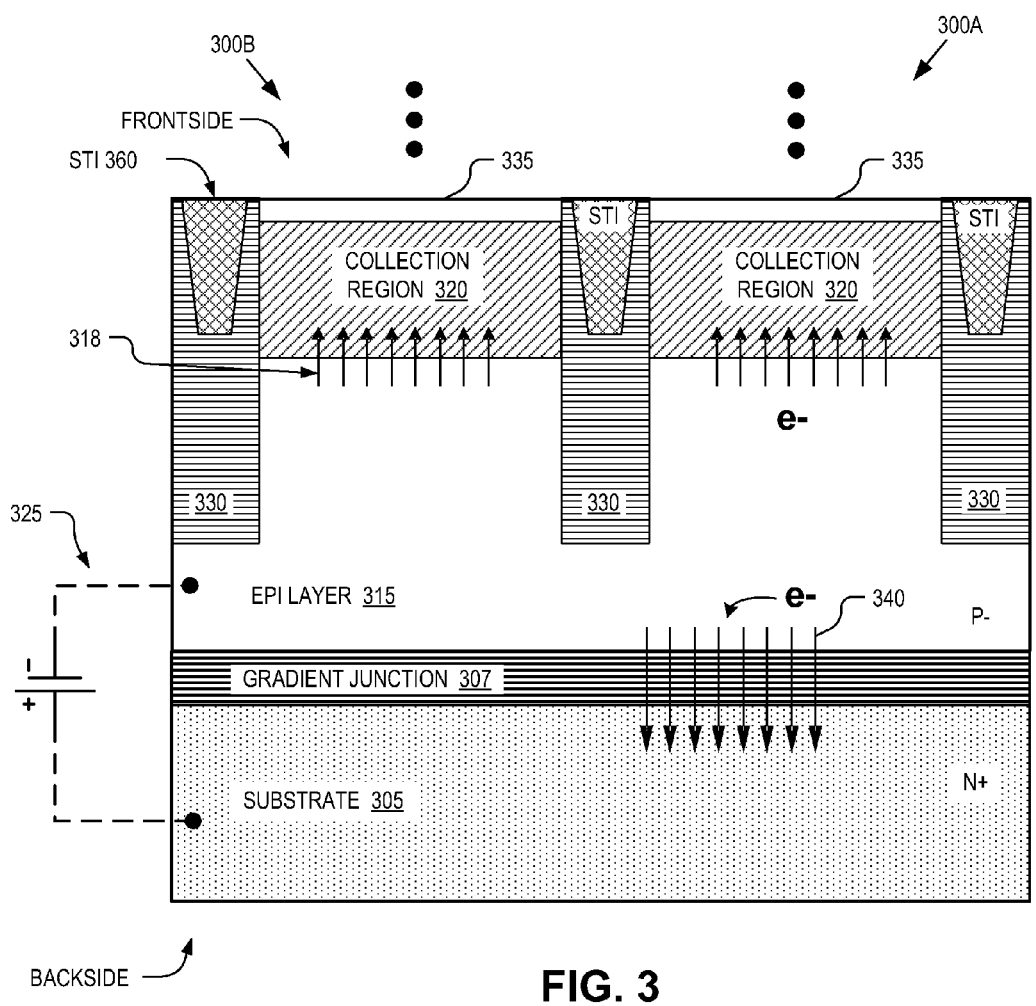
FIG. 3 is a cross sectional view of two neighboring CMOS image sensor pixels having a structure that reduces electrical crosstalk, in accordance with an embodiment.

Referring again to the figures, FIG. 3 is a cross sectional view of two neighboring CIS pixels 300A and 300B (collectively pixels 300) having a multilayer structure that reduces electrical crosstalk, in accordance with an embodiment. The illustrated embodiment of pixels 300 include a substrate 305, a gradient junction 307, an epitaxial ("epi") layer 315, collection regions 320, and a biasing circuit 325. Collection regions 320 of pixels 300A and 300B are isolated from each other by shallow trench isolations ("STI") 360 and dopant wells 330. In the illustrated embodiment, a pinning layer 335 (e.g., P type pinning) overlays collection regions 320 to passivate their surfaces.

In the embodiment illustrated in FIG. 3, substrate 305 is a silicon substrate highly doped with N type dopants (e.g., Arsenic; Phosphorous) while epi layer 315 is a silicon layer lightly doped with P type dopants (e.g., Boron). Collection regions 320 represent photosensitive regions (e.g., photodiode), which are doped with the same conductivity type as substrate 305. Dopant wells 330 are P wells for isolating adjacent collection regions 320 and preventing a direct interface between STI 360 and collection regions 320. However, it should be appreciated that the conductivity types of all the elements can be swapped such that substrate 305 is P+ doped, epi layer 315 is N− doped, collection regions 320 are P+ doped, and dopant wells 330 are N doped.

In one embodiment, electrical crosstalk between image sensor pixels is reduced relative to traditional CIS pixels by disposing a P− epi layer over an N type substrate. N type substrates may include silicon wafers doped with high concentrations of Arsenic or Phosphorous (also referred to as N+ substrates). Traditional CIS pixels typically use P type epitaxial layers (e.g., P− epi layer 315) disposed on P+ substrates When using N+ substrates, P type epi layer 315 may be fabricated by growing the P type epi layer on the N+ substrate. Electric field 340 (indicated by arrows) formed at the interface between P− epi layer 315 and N+ substrate 305 acts as a barrier to photo generated charge carriers (e.g., photo electrons) that are formed in N+ substrate 305. This barrier lowers the probability that a charge carrier formed deep in the CIS pixel structure can diffuse to an adjacent collection region 320. Similarly, this structure reduces blooming. If collection region 320 is full, uncollected electrons are drawn into N+ substrate 305 by electric field 340, rather than diffusing down around dopant wells 330 and into a neighboring collection region 320.

The junction between P− epi layer 315 and N+ substrate 305 is not infinitely abrupt. The N+ substrate is typically heavily doped with As or P. During the epitaxial growth, which is typically done at high temperatures (>800 C), N type dopants may diffuse into P− epi layer 315. In addition, thermal processing associated with CIS fabrication increases the N type dopant diffusion into epi layer 315. As such, the junction between substrate 305 and epi layer 315 is graded (illustrated as gradient junction 307). Electric field 340, and therefore the field barrier generated to reduce crosstalk and blooming, is dependent on the diffusion gradient profile. The final thickness of epi layer 315 after diffusion is thus dependent on the diffusion gradient profile. Because collection regions 320 are disposed within epi layer 315, the light collection efficiency and the degree of lateral charge carrier diffusion and blooming will vary with the CIS process thermal budget and the epitaxial layer growth process.

During operation, photo-generated charge carriers that are created shallow within epi layer 315 are collected by the electric field generated by the depletion region at the P-N junction between collection region 320 and epi layer 315. In contrast, photo-generated charge carriers that are created deep within epi layer 315 have a statistically increased chance of being drawn into substrate 305 by electric field 340 where they recombine without contributing to crosstalk. Similarly, photo-generated charge carriers that are created even deeper within substrate 305 are inhibited from diffusing up into a neighboring collection region 320 by the potential barrier created by field 340. Finally, in one embodiment, substrate 305 can be positively biased relative to epi layer 315 and collection regions 320 by biasing circuit 325. The presence of the biasing operates to further impede photo-electrons from crossing the potential barrier of field 340. It should be appreciated that in an embodiment where substrate 305 is a P+ substrate and epi layer 315 is an N− epi layer, biasing circuit 325 would be used to negatively bias substrate 305 relative to epi layer 315.

Figure 4:
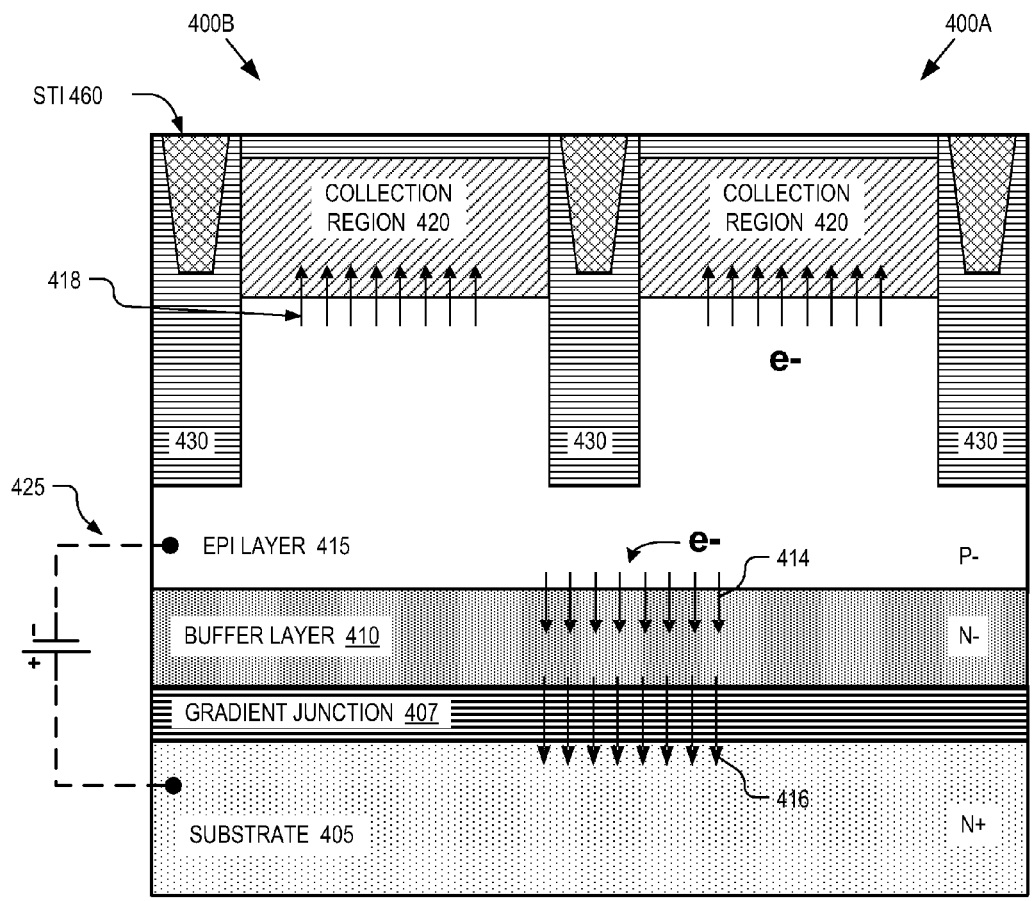
FIG. 4 is a cross sectional view of two neighboring CMOS image sensor pixels having a structure that reduces electrical crosstalk, in accordance with an embodiment.

FIG. 4 is a cross sectional view of two neighboring CIS pixels 400A and 400B (collectively pixels 400) having a multilayer structure that reduces electrical crosstalk, in accordance with an embodiment. Pixels 400 are similar to pixels 300 with the following exceptions. Pixels 400 include an additional buffer layer 410 having the same conductivity type doping as a substrate 405, but in a lesser concentration. Since the N type dopant concentration interface is not infinitely abrupt, a gradient junction 407 represents a graded dopant profile from N+ substrate 405 to a N− buffer layer 410. In one embodiment, pixels 400 may also include biasing circuit 425 to bias substrate 405 relative to collection regions 420 and an epi layer 415 (e.g., positive for N type substrate and collection regions or negatively for a P type substrate and collection regions).

The depletion region formed at the interface of N− buffer layer 410 and P− epi layer 415 generates an electric field 414, which draws deep photo-electrons into buffer layer 410 where they can recombine. In addition, a dopant gradient field 416 is generated at gradient junction 407, which also pulls photo-electrons generated in buffer layer 410 into substrate 405 or impedes the diffusion of photo-electrons generated in substrate 405 from migrating into buffer layer 410 and from there into epi layer 415.

Similar to epi layer 415, buffer layer 410 is an epitaxial layer grown over substrate 405 and serves a dual purpose. First, buffer layer 410 traps deep or excess photo-electrons resulting in a reduction in crosstalk and blooming. Second, buffer layer 410 serves as an N type diffusion buffer, preventing the high concentration N type dopants of substrate 405 from diffusing into the P type epi layer 415 during epitaxial growth cycles and the other high temperature CIS processes. The dopant concentration in buffer layer 410 is significantly lower than substrate 405, resulting in significantly less N type dopant diffusion into the P type epi layer 415. As such, buffer layer 410 can increase the thermal budget of pixels 400 during fabrication. Buffer layer 410 adds process margin to device fabricated on N+ substrates, which eases process development and process transfers. In addition, this multilayer structure is less dependent on a particular wafer vendor's growth conditions, allowing wider sources of starting material.

The lower thickness limit to buffer layer 410 is determined by the amount of dopant diffusion expected from substrate 405. However, the upper limit to the thickness of buffer layer 410 is not limited by the fabrication process. Photo-electrons present in buffer layer 410 will more easily diffuse to substrate 405 than cross the P-N junction barrier of field 414. Therefore a wide margin can be used in choosing the thickness of buffer layer 410. For example, buffer layer 410 may range from approximately 0.3 μm to 10 μm. The use of additional layers, in conjuction with optional applied bias from biasing circuit 425, to create additional barriers to diffusion of photo-generated carriers, may be further advantageous in reducing electrical crosstalk between image sensor pixels. The use of such additional layers is described herein in the following embodiments.

Figure 5:
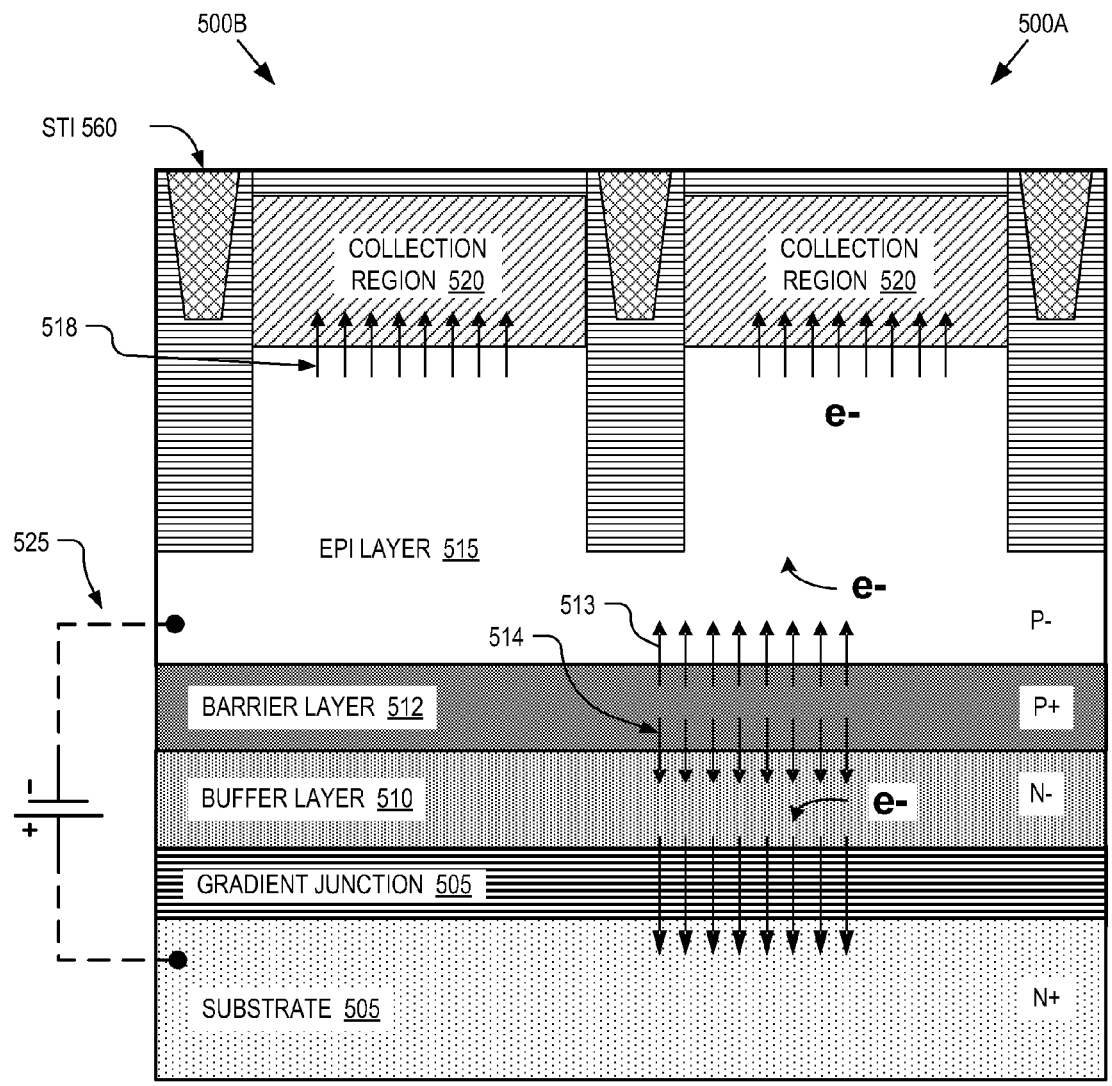
FIG. 5 is a cross sectional view of two neighboring image sensor pixels having a structure that reduces electrical crosstalk, in accordance with an embodiment.

FIG. 5 is a cross sectional view of two neighboring image sensor pixels 500A and 500B (collectively pixels 500) having a multilayer structure that reduces electrical crosstalk, in accordance with an embodiment. Pixels 500 are similar to pixels 400 with the following exceptions. Pixels 500 include a barrier layer 512 disposed between an epi layer 515 and buffer layer 510. Barrier layer 512 has the same conductivity type as epi layer 515 (e.g., P type), but with a greater dopant concentration than epi layer 515. In an alternative embodiment, pixels 500 include barrier layer 512, but lack buffer layer 510. Fabrication of such an embodiment may have less complexity but may also have reduced performance.

Barrier layer 512 serves at least two purposes. On the photodiode side, barrier layer 512 creates an electric field 513 that drives photo-electrons present in epi layer 515 up towards collection regions 520. On the substrate side, the depletion region formed at the interface of barrier layer 512 and buffer layer 510 creates an electric field 514 which draws deep photo-generated carriers into the buffer layer where they recombine. Electric field 514 is also a potential barrier that photo-generated carriers in buffer layer 510 must overcome to diffuse into epi layer 515. Accordingly, barrier layer 512 impedes deep photo-electrons from migrating into neighboring collection region 520 while promoting the collection of shallow photo-electrons by driving them upwards toward collection region 520 and mitigating lateral drift. The size of the potential barrier formed by electric field 514 is dependent upon the dopant concentrations of buffer layer 510 and barrier layer 512. Barrier layer 512 may be doped via ion implantation of buffer layer 510, or grown epitaxially using controlled growth conditions. In one embodiment, pixels 500 may also include a biasing circuit 525 to bias substrate 505 relative to collection regions 520 and epi layer 515 (e.g., positive for N type substrate and N type collection regions or negatively for a P type substrate and P type collection regions).

Figure 6:
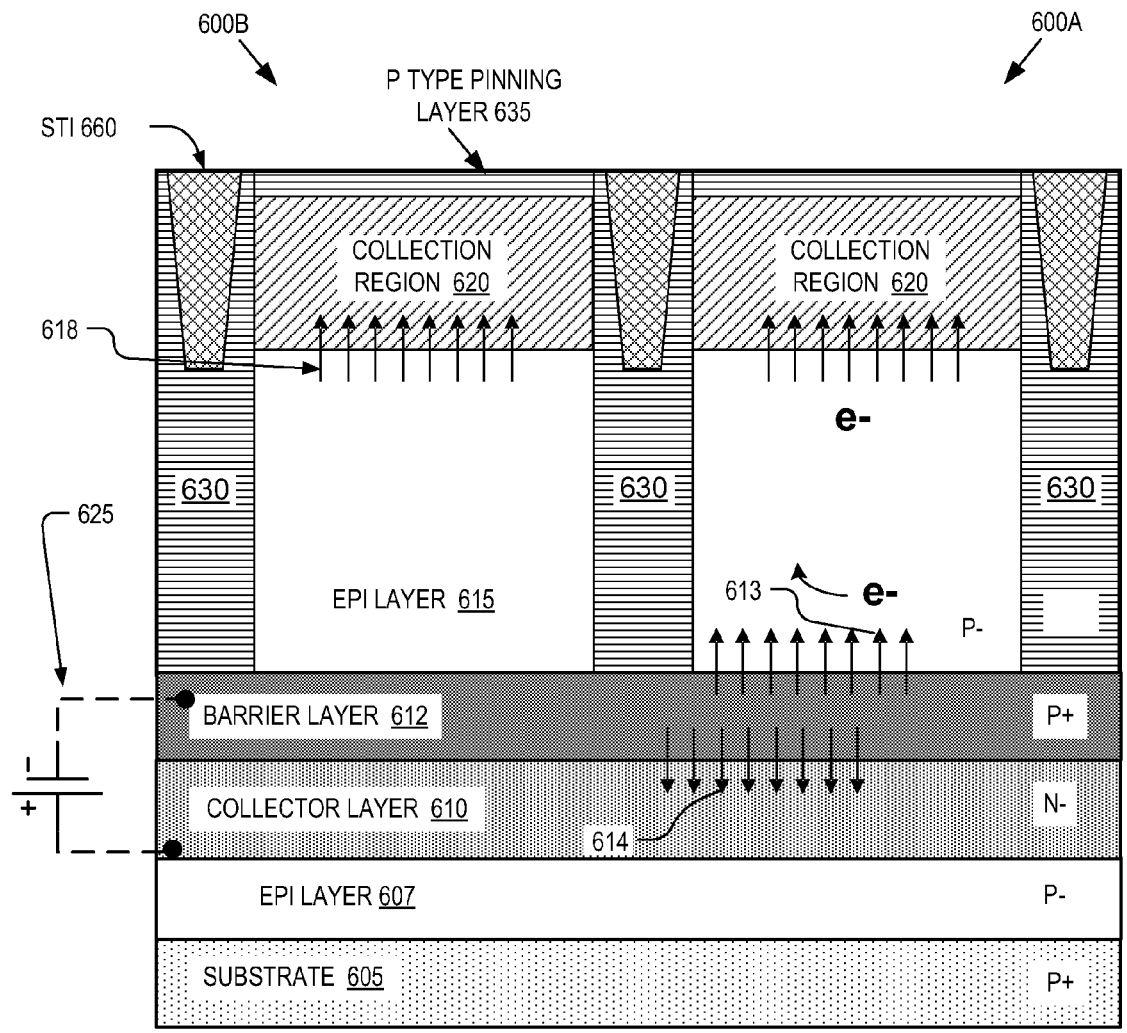
FIG. 6 is a cross sectional view of two neighboring image sensor pixels having a structure that reduces electrical crosstalk, in accordance with an embodiment.

FIG. 6 is a cross sectional view of two neighboring image sensor pixels 600A and 600B (collectively pixels 600) having a multilayer structure that reduces electrical crosstalk, in accordance with an embodiment. The illustrated embodiment of pixels 600 includes a substrate 605, an epitaxial ("epi") layer 607, a collector layer 610, a barrier layer 612, an epi layer 615, collection regions 620, and a biasing circuit 625. The collection regions 620 of each pixel 600 are isolated from each other with STI 660 and dopant wells 630. In the illustrated embodiment, a pinning layer 635 (e.g., P type pinning) overlays collection regions 620 to passivate their surfaces.

Referring still to the embodiment illustrated in FIG. 6, substrate 605 is a silicon substrate highly doped with P type dopants (e.g., Boron) while epi layers 607 and 615 are silicon layers lightly doped with P type dopants (e.g., Boron). Collector layer 610 is doped with N type dopants. Barrier layer 612 is doped with P type dopants, but with a greater dopant concentration than epi layer 615. Collection regions 620 represent photosensitive regions (e.g., photodiodes), which are doped with the N-type dopants. Dopant wells 630 are P wells for isolating adjacent collection regions 620 and preventing a direct interface between STI 660 and collection regions 620. In one embodiment dopant wells 630 optionally extend down to reach barrier layer 612 (illustrated in FIG. 6). By electrically coupling dopant wells 630 to barrier layer 612, excess charges that are formed or migrate into dopant wells 630 are electrostatically carried away from collection regions 620 and drawn down into collector layer 610.

It should be appreciated that the conductivity types of all the elements can be swapped such that substrate 605 is N+ doped, epi layer 615 is N− doped, collection regions 620 are P doped, dopant wells 630 are N doped, collector layer 610 is P doped, and barrier layer 612 is N doped. In such a case any applied bias voltage at biasing circuit 625 would have a polarity opposite that illustrated in FIG. 6.

Barrier layer 612 serves at least two purposes. On the photodiode side, barrier layer 612 creates an electric field 613 that drives photo-electrons present in epi layer 615 up towards collection regions 620. On the substrate side, the depletion region formed at the interface of barrier layer 612 and buried collector layer 610 creates an electric field 614 that draws deep photo-generated carriers into the buried collector layer where they recombine. Electric field 614 is also a potential barrier that photo-generated carriers in collector layer 610 must overcome to diffuse into epi layer 615. Accordingly, barrier layer 612 impedes deep photo-electrons from migrating into a neighboring collection region 620 while promoting the collection of shallow photo-electrons by driving them towards collection region 620 and mitigating their lateral migration. The size of the potential barrier is dependent upon the thickness and dopant concentrations of barrier layer 612. Barrier layer 612 may have a thickness of approximately 0.3 μm to 10 μm and a doping concentration of approximately $2 \times 10^{16}$ atoms/cm$^3$ to $2 \times 10^{18}$ atoms/cm$^3$.

Collector layer 610 may have a thickness of approximately 0.3 μm to 10 μm and a dopant concentration of approximately $1 \times 10^{16}$ atoms/cm$^3$ to $1 \times 10^{18}$ atoms/cm$^3$. In one embodiment, the doping concentration of collector layer 610 is less than the doping concentration of barrier layer 612. Of course, pixels 600 may also include a biasing circuit 625 to bias collector layer 610 relative to epi layer 615 (e.g., positive for N type collection regions or negatively for P type collection regions).

During operation of image sensor pixel 600, photo-generated charge carriers that are created shallow within epi layer 615 are collected by electric field 618 generated by the depletion region at a P-N junction formed between collection region 620 and epi layer 615. In contrast, photo-generated charge carriers that are created deep within epi layer 615 may either be driven up towards collection regions 620 by electric field 613 or be drawn into collector layer 610 by electric field 614 where they recombine without contributing to crosstalk. Also, when collection regions 620 have reached their maximum capacity, any additional carriers may overcome electric field 613 and be drawn by electric field 614 into collector layer 610 without contributing to blooming. Similarly, photo-generated charge carriers that are created even deeper within collector layer 610, epi layer 607, and substrate 605 are inhibited from diffusing up into a neighboring collection region 620 by the potential barrier created by electric field 614. Finally, in one embodiment, collector layer 610 can be positively biased relative to epi layer 615 and collection regions 620 by biasing circuit 625. The presence of the biasing operates to further impede photo-electrons from crossing the potential barrier of field 614. Epi layers 607 and 615, and substrate 605 may typically be electrically grounded but depending on the application other structures may be grounded as well. It should be appreciated that in an embodiment where collector layer 610 is P+ doped and epi layer 615 is an N− epi layer, the biasing circuit 625 would negatively bias substrate 610 relative to epi layer 615.

Figure 7:
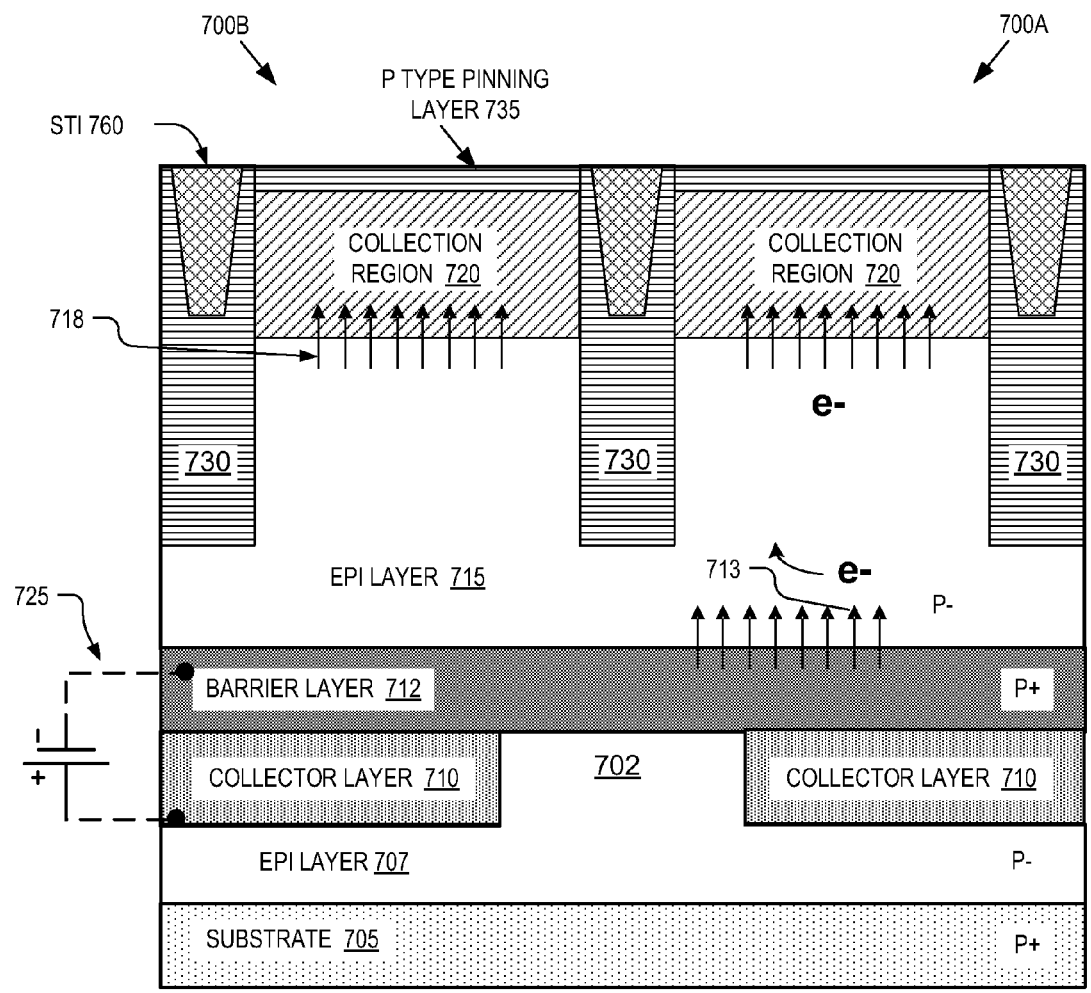
FIG. 7 is a cross sectional view of two neighboring image sensor pixels having a structure that reduces electrical crosstalk, in accordance with an embodiment.

FIG. 7 is a cross sectional view of two neighboring image sensor pixels 700A and 700B (collectively pixels 700) having a multilayer structure that further reduces electrical crosstalk, in accordance with an embodiment. Pixels 700 are similar to pixels 600 with the following exceptions. Collector layer 710 is formed by ion implantation of selected regions of epi layer 707, resulting in the creation of electrical pass-through 702 between barrier layer 712 and epi layer 707 at selected locations. Electrical pass-through 702 is an area of epi layer 707 that is not selected to become collector 710 by ion implantation. Electrical pass-through 702 allows for more efficient draining of electrical carriers from epi layer 707 into barrier layer 712. In an embodiment where barrier layer 712 is doped P type, photon generated holes may be improperly drained from barrier layer 712 without the presence of electrical pass-through 702. Electrical pass-through 702 may be maintained along barrier layer 712 in a specific pattern (e.g. under pixels having one or more specific color filters) or they could be placed less frequently and/or randomly within the array. Other design parameters for electrical pass-through 702 such as density and size depend, for example, on the barrier layer resistance, the number of neighboring pixels within a pixel array, and the size of each collection region 720.

Figure 8:
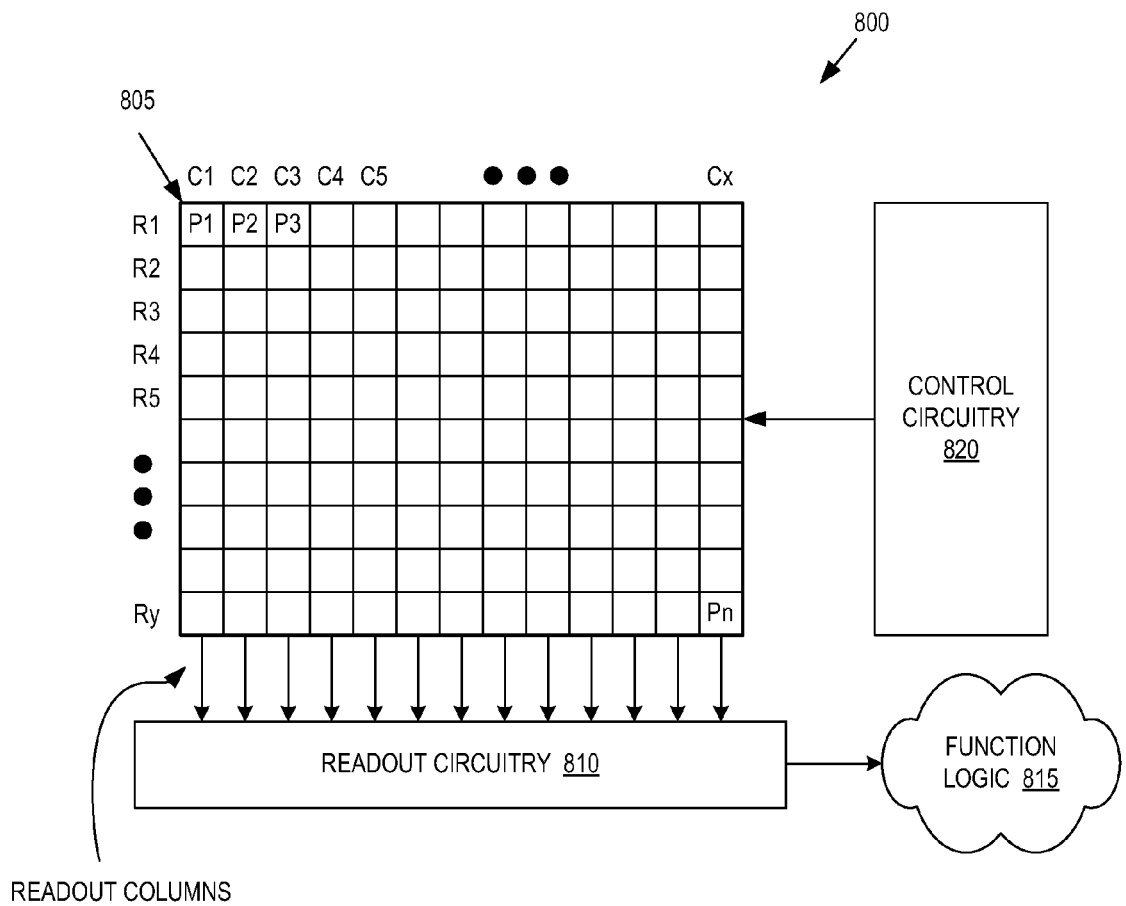
FIG. 8 is a functional block diagram illustrating a sensor, in accordance with an embodiment.

FIG. 8 is a functional block diagram illustrating a CIS 800, in accordance with an embodiment. The illustrated embodiment of CIS 800 includes pixel array 805 having improved electrical crosstalk characteristics, readout circuitry 810, function logic 815, and control circuitry 820.

Pixel array 805 is a two-dimensional ("2D") array of image sensor pixels (e.g., pixels P1, P2 . . . , Pn). In one embodiment, each pixel represents any of pixels 300, 400, 500, 600 or 700, illustrated in FIGS. 3-7. In one embodiment, each pixel is a CIS pixel. In one embodiment, pixel array 805 includes a color filter array including a color pattern (e.g., Bayer pattern or mosaic) of red, green, and blue filters. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by readout circuitry 810 and transferred to function logic 815. Readout circuitry 810 may include amplification circuitry, analog-to-digital ("ADC") conversion circuitry, or otherwise. Function logic 815 may simply store the image data or even manipulate the image data by applying post image effects (e.g., crop, rotate, remove red eye, adjust brightness, adjust contrast, or otherwise). In one embodiment, readout circuitry 810 may readout a row of image data at a time along readout column lines (illustrated) or may readout the image data using a variety of other techniques (not illustrated), such as a column/row readout, a serial readout, or a full parallel readout of all pixels simultaneously.

Control circuitry 820 is connected with pixel array 805 to control operational characteristic of pixel array 805. For example, control circuitry 820 may generate a shutter signal for controlling image acquisition. In one embodiment, the shutter signal is a global shutter signal for simultaneously enabling all pixels within pixel array 805 to simultaneously capture their respective image data during a single acquisition window. In an alternative embodiment, the shutter signal is a rolling shutter signal whereby each row, column, or group of pixels is sequentially enabled during consecutive acquisition windows.

FIG. 9 is a circuit diagram illustrating pixel circuitry 900 of two four-transistor ("4T") pixels within a pixel array, in accordance with an embodiment. Pixel circuitry 900 is one possible pixel circuitry architecture for implementing each pixel within pixel array 805 of FIG. 8. However, it should be appreciated that the embodiments described herein are not limited to 4T pixel architectures; rather, one of ordinary skill in the art having the benefit of the instant disclosure will understand that the present teachings are also applicable to 3T designs, 5T designs, and various other pixel architectures.

In FIG. 9, pixels Pa and Pb are arranged in two rows and one column. The illustrated embodiment of each pixel circuitry 900 includes a photodiode PD, a transfer transistor T1, a reset transistor T2, a source-follower ("SF") transistor T3, and a select transistor T4. During operation, transfer transistor T1 receives a transfer signal TX, which transfers the charge accumulated in photodiode PD to a floating diffusion node FD. In one embodiment, floating diffusion node FD may be coupled to a storage capacitor for temporarily storing image charges.

Reset transistor T2 is coupled between a power rail VDD and the floating diffusion node FD to reset the pixel (e.g., discharge or charge the FD and the PD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance connection to the floating diffusion FD. Finally, select transistor T4 selectively couples the output of pixel circuitry 900 to the readout column line under control of a select signal SEL.

In one embodiment, the TX signal, the RST signal, and the SEL signal are generated by control circuitry 820. In an embodiment where pixel array 805 operates with a global shutter, the global shutter signal is coupled to the gate of each transfer transistor T1 in the entire pixel array 805 to simultaneously commence charge transfer from each pixel's photodiode PD. Alternatively, rolling shutter signals may be applied to groups of transfer transistors T1.

Figure 10:
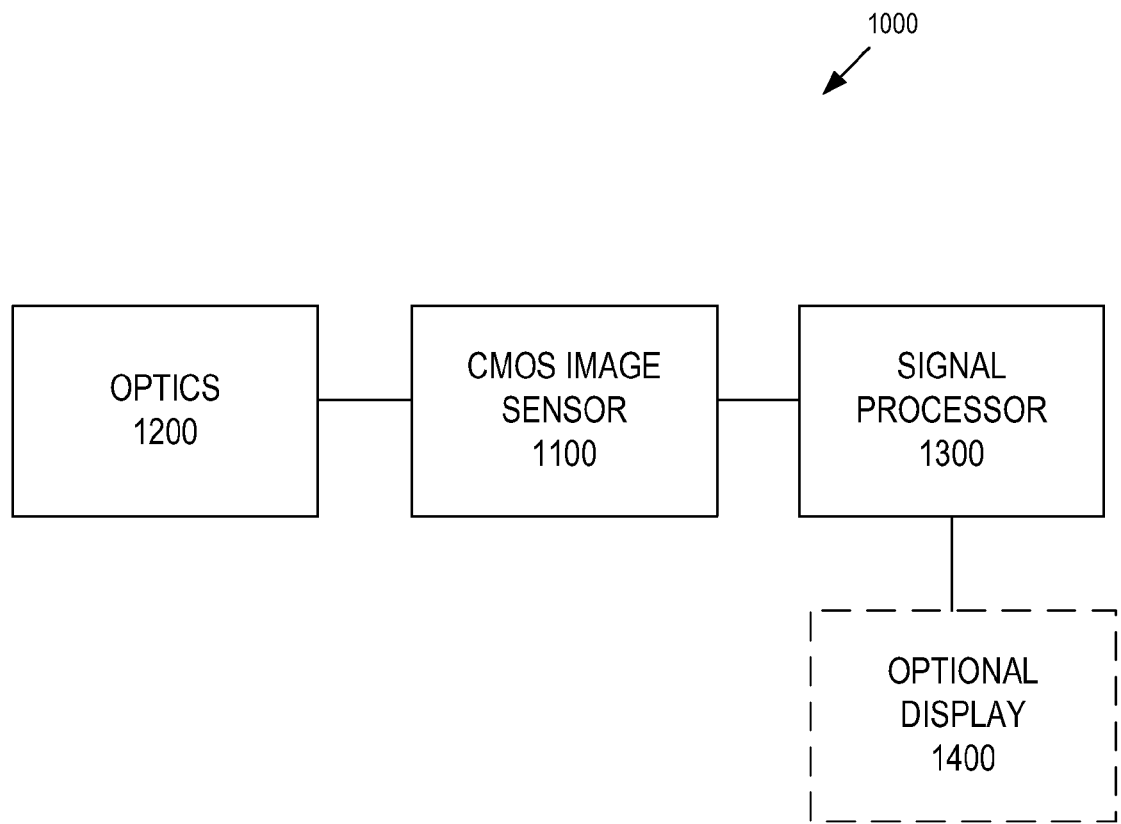
FIG. 10 is a block diagram illustrating an imaging system with reduced electrical crosstalk, in accordance with an embodiment.

FIG. 10 illustrates an imaging system 1000 that utilizes a CMOS image sensor 1100 having image sensor pixel structures providing reduced electrical crosstalk, according to any of the embodiments disclosed herein. Image system 1000 further includes imaging optics 1200 for directing light from an object to be imaged onto CMOS image sensor 1100, and may also include a signal processor 1300 for producing processed image data for display on optional display 1400.

The above description of illustrated embodiments, including what is described in the Abstract, is not intended to be exhaustive or to limit the embodiments to the precise forms disclosed. While specific embodiments are described herein for illustrative purposes, various modifications are possible within the scope, as those skilled in the relevant art will recognize. These modifications can be made in light of the above detailed description. Examples of some such modifications include dopant concentration, layer thicknesses, and the like. Further, although the embodiments illustrated herein refer to CMOS sensors using frontside illumination, it will be appreciated that they may also be applicable to CMOS sensors using backside illumination.

The terms used in the following claims should not be construed to limit the disclosure to the specific embodiments disclosed in the specification. Rather, the scope is to be determined entirely by the following claims, which are to be construed in accordance with established doctrines of claim interpretation.

What is claimed is:

1. A method of operating an image sensor, comprising:
   collecting charge carriers within collection regions disposed within a first P type epitaxial layer in response to light incident on the image sensor;
   generating a first field at a junction between an N type collector layer and a P type barrier layer to draw excess charge carriers generated within the P type barrier layer away from the collection regions into the N type collector layer, wherein the N type collector layer and the P type barrier layer are disposed between a substrate layer and the first P type epitaxial layer, wherein a second P type epitaxial layer is disposed between the substrate layer and the N type collector layer;
   generating a second field at a junction between the P type barrier layer and the first P type epitaxial layer to push photo-electrons generated within the first P type epitaxial layer towards the collection regions; and
   electrically coupling the second P type epitaxial layer to the P type barrier layer via electrical pass-throughs selectively disposed through the N type collector layer.

2. The method of claim 1, wherein the image sensor comprises a complementary metal-oxide-semiconductor ("CMOS") image sensor.

3. The method of claim 1, wherein the P type barrier layer is electrically coupled to P wells separating adjacent collection regions, the method further comprising:
   electrostatically drawing excess charge carriers within the P wells down through the barrier layer towards the collector layer.

4. The method of claim 1, wherein the P type barrier layer has a higher concentration of P type dopants than the first P type epitaxial layer, wherein the second field comprises a P type dopant concentration gradient, and wherein the first field comprises an electrostatic field due to a depletion region.

5. The method of claim 1, further comprising positively biasing the N type collector layer relative to the P type barrier layer.

6. The method of claim 1, wherein the substrate layer comprise a P type substrate.

7. The method of claim 1, wherein the N type collector layer has a dopant concentration of approximately $10^{16}$ atoms/cm$^3$ to $10^{17}$ atoms/cm$^3$.

8. The method of claim 1, wherein the N type collector layer is about 0.3 μm to 10 μm thick.

9. The method of claim 1, wherein the P type barrier layer has a dopant concentration of approximately $10^{17}$ atoms/cm$^3$ to $10^{18}$ atom/cm$^3$.

10. The method of claim 1, wherein the P type barrier layer has a thickness of approximately 0.3 um to 1.0 um.

11. A method of operating an image sensor, comprising: collecting charge carriers within collection regions disposed within a first N type epitaxial layer in response to light incident on the image sensor; generating a first field at a junction between a P type collector layer and a N type barrier layer to draw excess charge carriers generated within the N type barrier layer away from the collection regions into the P type collector layer, wherein the P type collector layer and the N type barrier layer are disposed between a substrate layer and the first N type epitaxial layer, wherein a second N type epitaxial layer is disposed between the substrate layer and the P type collector layer; generating a second field at a junction between the N type barrier layer and the first N type epitaxial layer to push photo-generated charge carriers generated within the first N type epitaxial layer towards the collection regions; and electrically coupling the second N type epitaxial layer to the N type barrier layer via electrical pass-throughs selectively disposed through the P type collector layer.

* * * * *